(12) United States Patent
Min et al.

(10) Patent No.: US 6,943,040 B2
(45) Date of Patent: Sep. 13, 2005

(54) MAGNETIC RANDOM ACCESS MEMORY DESIGNS WITH CONTROLLED MAGNETIC SWITCHING MECHANISM BY MAGNETOSTATIC COUPLING

(75) Inventors: Tai Min, San Jose, CA (US); Po Kang Wang, Milpitas, CA (US)

(73) Assignee: Headway Technologes, Inc., Milpitas, CA (US)

( * ) Notice: Subject to any disclaimer, the term of this patent is extended or adjusted under 35 U.S.C. 154(b) by 71 days.

(21) Appl. No.: 10/650,600

(22) Filed: Aug. 28, 2003

(65) Prior Publication Data

US 2005/0045931 A1 Mar. 3, 2005

(51) Int. Cl.$^7$ ............................................. H01L 21/00
(52) U.S. Cl. ............................ 438/3; 365/55; 365/66; 365/171; 365/173; 365/225.5; 365/230.03; 438/673
(58) Field of Search .................... 365/55, 171, 173, 365/225.5, 230.03; 438/673

(56) References Cited

U.S. PATENT DOCUMENTS

| | | | |
|---|---|---|---|
| 5,757,695 A | 5/1998 | Shi et al. ..................... | 365/158 |
| 6,005,800 A | 12/1999 | Koch et al. .................. | 365/173 |
| 6,166,948 A | 12/2000 | Parkin et al. ................ | 365/173 |
| 6,242,770 B1 | 6/2001 | Bronner et al. ............. | 257/295 |
| 6,335,890 B1 * | 1/2002 | Reohr et al. ............. | 365/225.5 |
| 6,376,260 B1 | 4/2002 | Chen et al. .................... | 438/3 |

OTHER PUBLICATIONS

U.S. Appl. No. 10/647,716, filed Aug. 25, 2003, assigned to the same assignee.

* cited by examiner

*Primary Examiner*—David Nelms
*Assistant Examiner*—Mai-Huong Tran
(74) *Attorney, Agent, or Firm*—George O. Saile; Stephen B. Ackerman

(57) ABSTRACT

A magnetic tunneling junction (MTJ) memory cell for a magnetic random access memory (MRAM) array is formed as a chain of magnetostatically coupled segments. The segments can be circular, elliptical, lozenge shaped or shaped in other geometrical forms. Unlike the isolated cells of typical MTJ designs which exhibit curling of the magnetization at the cell ends and uncompensated pole structures, the present multi-segmented design, with the segments being magnetostatically coupled, undergoes magnetization switching at controlled nucleation sites by the fanning mode. As a result, the multi-segmented cells of the present invention are not subject to variations in switching fields due to shape irregularities and structural defects.

3 Claims, 3 Drawing Sheets

FIG. 2a - Prior Art

MAGNETIC RANDOM ACCESS MEMORY DESIGNS WITH CONTROLLED MAGNETIC SWITCHING MECHANISM BY MAGNETOSTATIC COUPLING

RELATED PATENT APPLICATION

This application is related to Ser. No. 10/647,716, filing date (Aug. 25, 2003), assigned to the same assignee as the current invention.

BACKGROUND OF THE INVENTION

1. Field of the Invention

This invention relates to the use of magnetic tunnel junctions (MTJ) as storage elements (cells) in non-volatile memory cell arrays, called magnetic random access memories (MRAM). In particular it relates to MRAM arrays whose cells consist of chains of magnetostatically coupled segments, the design providing artificial nucleation sites for uniform magnetic switching between multi-stable states.

2. Description of the Related Art

The magnetic tunnel junction (MTJ) basically comprises two electrodes, which are layers of ferromagnetic material, separated by a tunnel barrier layer, which is a thin layer of insulating material. The tunnel barrier layer must be sufficiently thin so that there is a probability for charge carriers (typically electrons) to cross the layer by means of quantum mechanical tunneling. The tunneling probability is spin dependent, depending on the orientation of the electron spin relative to the magnetization direction of the ferromagnetic layers. Thus, if these magnetization directions are varied, the tunneling current will also vary as a function of the relative directions for a given applied voltage. As a result of the behavior of an MTJ, sensing the change of tunneling current for a fixed potential can enable a determination of the relative magnetization directions of the two ferromagnetic layers that comprise it. Equivalently, the resistance of the MTJ can be measured, since different relative magnetization directions will produce different resistances.

The use of an MTJ as an information storage device requires that the magnetization of at least one of its ferromagnetic layers can be varied relative to the other and also that changes in the relative directions can be sensed by means of variations in the tunneling current or, equivalently, the junction resistance. In its simplest form as a two state memory storage device, the MTJ need only be capable of having its magnetizations put into parallel or antiparallel configurations (writing) and that these two configurations can be sensed by tunneling current variations or resistance variations (reading). In practice, the free ferromagnetic layer can be modeled as having a magnetization which is free to rotate but which energetically prefers to align in either direction along its easy axis (the direction of magnetic crystalline anisotropy). The magnetization of the fixed layer may be thought of as being permanently aligned in its easy axis direction. When the free layer is anti-aligned with the fixed layer, the junction will have its maximum resistance, when the free layer is aligned with the fixed layer, the minimum resistance is present. In typical MRAM circuitry, the MTJ devices are located at the intersection of current carrying lines called word lines and bit lines (or word lines and sense lines). When both lines are activated, the device is written upon, ie, its magnetization direction is changed. When only one line is activated, the resistance of the device can be sensed, so the device is effectively read. In this regard, Bronner et al. (U.S. Pat. No. 6,242,770 B1) teaches a method for forming thin film conductors as word and bit lines so that the MTJ device is in close proximity to a lower line and a diode is located below that line.

In order for the MTJ MRAM device to be competitive with other forms of DRAM, it is necessary that the MTJ be made very small, typically of sub-micron dimension. Parkin et al. (U.S. Pat. No. 6,166,948) notes that sub-micron dimensions are needed to be competitive with DRAM memories in the range of 10–100 Mbit capacities. Parkin also notes that such small sizes are associated with significant problems, particularly super-paramagnetism, which is the spontaneous thermal fluctuation of magnetization produced by in samples of ferromagnetic material too small to have sufficient magnetic anisotropy (a measure of the ability of a sample to maintain a given magnetization direction). Another size-related problem results from non-uniform and uncontrollable edge-fields produced by shape-anisotropy (a property of non-circular samples). As the cell size decreases, these edge fields become relatively more important than the magnetization of the body of the cell and have an adverse effect on the storage and reading of data. Although such shape-anisotropies, when of sufficient magnitude, reduce the disadvantageous effects of super-paramagnetism, they have the negative effect of requiring high currents to change the magnetization direction of the MTJ for the purpose of storing data. To counteract these edge effects, Shi et al. (U.S. Pat. No. 5,757,695) teaches the formation of an ellipsoidal MTJ cell wherein the magnetization vectors are aligned along the length (major axis) of the cell and which do not present variously oriented edge domains, high fields and poles at the ends of the element.

MTJ devices have been fabricated in several configurations, one type comprising a free ferromagnetic layer separated from a fixed (or pinned) layer. In such a configuration, the MTJ has data stored in it by causing the magnetization of its free layer to be either parallel or antiparallel to that of the pinned layer. The pinned layer may itself be a composite layer formed of two ferromagnetic layers held in an antiparallel magnetization configuration by some form of magnetic coupling so that it presents a zero or negligible net magnetic moment to the MTJ. Such an arrangement is advantageous in reducing edge effects due to anisotropies. Parkin, cited above, teaches an improved MTJ cell utilizing a free layer that comprises two ferromagnetic layers that are coupled by their dipolar fields in an antiparallel magnetization configuration to produce a small, but non-zero, magnetic moment. When written on by an external applied magnetic field, the two magnetic moments switch directions simultaneously so that the net magnetic moment of the free layer switches direction relative to the pinned layer.

It is undesirable for MTJ devices to have excessive magnetic coupling between adjacent magnetic layers of neighboring devices or even within the same device as this coupling must be overcome when writing on the device. As noted above, edge anisotropies are one source of undesirable coupling. Another source results from non-planar surfaces at the interfaces of ferromagnetic layers, such as might occur between the fixed and free layer of an MTJ. This is known as topological coupling. Chen et al. (U.S. Pat. No. 6,376,260 B1) teach an improved fabrication method in which the magnetic element includes a first electrode (a fixed layer), a second electrode (a free layer) and a spacer layer between them. The thicknesses of the first and second electrodes are in a special relationship to each other such that the net magnetic field at the interface between the free and spacer layers is zero.

Koch et al. (U.S. Pat. No. 6,005,800) deal with the problem that results when writing to one specific cell also affects the magnetization directions of adjacent cells that are not being addressed. Koch teaches the formation of cells with two shapes, which are mirror images of each other. The cells are arranged in a checkerboard pattern, so that a cell of one shape is surrounded by cells of the other shape. Since neighboring cells thereby have their preferred magnetization vectors oriented differently, there is a reduced probability that writing to one cell type will affect the magnetization of the other type.

As has been discussed, many of the problems associated with the construction of MRAM arrays are related to the shapes of the cells. Cell shapes of present designs are typically single element rectangle, elliptical or lozenge. Any irregularities of these shapes, or defects at their edges produced during their formation, will result in coercivity fluctuations distributed throughout the array. It is the object of the present invention to control the problem of undesirable edge effects more effectively than in the prior art by dividing single elements into multi-sections, thus providing nucleation sites at which switching can occur and whose presence will dominate the adverse affects of unintentionally generated shape irregularities or edge defects.

SUMMARY OF THE INVENTION

A first object of this invention is to provide a novel MTJ device whose magnetization switching properties are insensitive to shape irregularities and edge defects and which can be used to form an MRAM array.

A second object of this invention is to provide an MRAM array of such MTJ devices, in which array coercivity variations and resulting switching field variations due to shape irregularities and edge defects in the MTJ devices is eliminated or greatly reduced.

A third object of this invention is to provide such an MRAM array in which problems of write selectivity, ie, writing onto unintended array locations, is eliminated or greatly reduced.

A fourth object of this invention is to provide an MRAM cell array design which is less dependent on the shape of individual cell elements for its performance.

A fifth object of the present invention is to provide an MRAM cell array whose switching properties are uniform at all points of the array.

A sixth object of the present invention is to provide an MRAM cell array design in which the threshold for switching is reduced.

A seventh object of the present invention is to provide design control of MRAM cell coercivity.

An eighth object of the present invention is to allow the lowering of write-current power consumption by design choices of crystalline anisotropy directions during cell fabrication.

These objects will be achieved by a design method that introduces intentionally formed nucleation sites into the MTJ cells of an MRAM array. Nucleation sites are places at which magnetization switching first occurs and upon which the switching field between magnetization states can more effectively act and which, thereby, lower the switching thresholds of the cells in the array. This is done by designing novel MTJ memory cells which are formed, by photolithography and ion-milling, into chains of two or more discrete segments which are magnetostatically coupled (such coupling being easier to overcome than exchange coupling). The magnetostatic coupling between cell segments produces an anisotropy, called "interaction anisotropy," which is significantly smaller than the dominant shape anisotropy. By choosing proper shapes and alignments of the segments, the shape anisotropy can then be eliminated as a determining factor in cell coercivity and the major contribution to the coercivity of the cell becomes the crystalline anisotropy, which is larger than the interaction anisotropy but which can be controlled by the designer and set in various directions relative to the axes of the cell segments. Since the crystalline anisotropy is significantly less than the shape anisotropy, the necessity of using high write currents is eliminated and write-current power consumption is reduced.

A further advantage offered by the invention is that the magnetostatic coupling between cell segments eliminates the curling back of the field lines at the cell edges which is an energetically favorable configuration in the isolated cells of the prior art. State switching within cells having such magnetization variations at their edges is inherently unstable. In the present invention, the magnetostatic coupling between cell segments makes the mode of state-switching between magnetizations the more energetically favorable and more stable fanning mode in which the ends of the magnetization of each segment are magnetostatically coupled to each other. The region between adjacent discrete segments, at which the magnetization vectors are so coupled, also forms an advantageous nucleation site for the action of switching fields.

The MTJ configuration for the cell segments preferred for the use of this method comprises a ferromagnetic free layer separated by an insulating tunneling junction layer from a magnetically pinned (magnetization fixed in direction) layer which is a synthetic antiferromagnetic multilayer with zero magnetic moment (for weak magnetostatic coupling to the free layer). This synthetic antiferromagnetic pinned layer comprises a first ferromagnetic layer having a first magnetization direction, a second ferromagnetic layer having a second magnetization direction opposite to the first direction, a non-magnetic coupling layer formed between the first and second ferromagnetic layers and an antiferromagnetic layer formed on the second ferromagnetic layer which pins both ferromagnetic layers of the fixed layer in their mutually antiparallel configuration. The MTJ configuration can also utilize a free layer which is formed as a pair of strongly or weakly coupled antiparallel magnetized ferromagnetic layers.

BRIEF DESCRIPTION OF THE DRAWINGS

FIGS. 2a and 2b show, respectively a prior art elliptical cell of aspect ratio 2 and the replacement of said cell in the present invention by two circular elements of identical radii

DESCRIPTION OF THE PREFERRED EMBODIMENT

The preferred embodiment of the present invention teaches a method of forming an MRAM cell array of novel segmented MTJ devices of approximately sub-micron dimensions, said array thereby having a structure and design that provides a lowered threshold for state switching and a uniformity of coercivity across the array. The design of the array replaces a single MTJ cell element, such as is found with various shapes in the prior art, with elements which are formed of magnetostatically coupled discrete segments. These discrete elements are linked in chainlike configurations such as those shown in FIGS. 1a–d. The segmentation offers at least the following three advantages: 1) a reduction of the switching field threshold dependence on individual cell geometry and a corresponding ability to control write power consumption by varying the direction of crystalline anisotropy; 2) a preferred path of switching which is a fanning mode, wherein the ends of the magnetization vectors of individual segments are coupled at the segment edges; 3) artificial nucleation sites produced by segmentation which provide significantly lower switching thresholds than the uncontrollable edge and shape defects common to unsegmented cells.

Figure 1A:
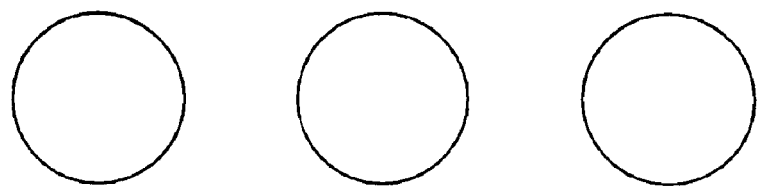
FIGS. 1a–1d are schematic illustrations of several different design patterns of MTJ cells formed of segmented chains in accord with the present invention.
Figure 1B:
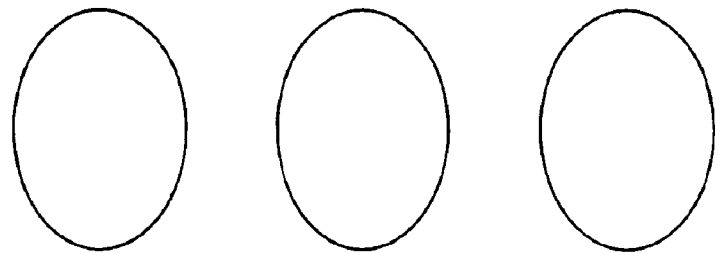
Figure 1C:
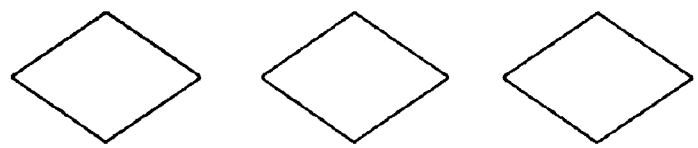
Figure 1D:
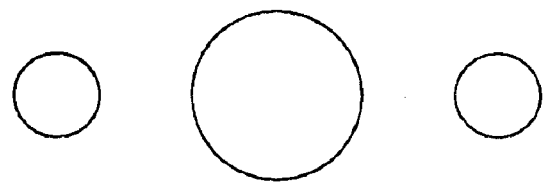

Referring first to FIGS. 1a–d, there is shown, in accord with the present invention, chains of prior art shapes broken up into (for example) three segments by photolithography and ion-milling. FIG. 1a shows a chain of 3 identical circles, FIG. 1b shows a chain of 3 identical ellipses having their major axes perpendicular to the chain direction, FIG. 1c shows a chain of 3 identical lozenges and FIG. 1d shows a chain of 3 unequal circles. The shape of chain elements and their number is a design choice.

Figure 2B:
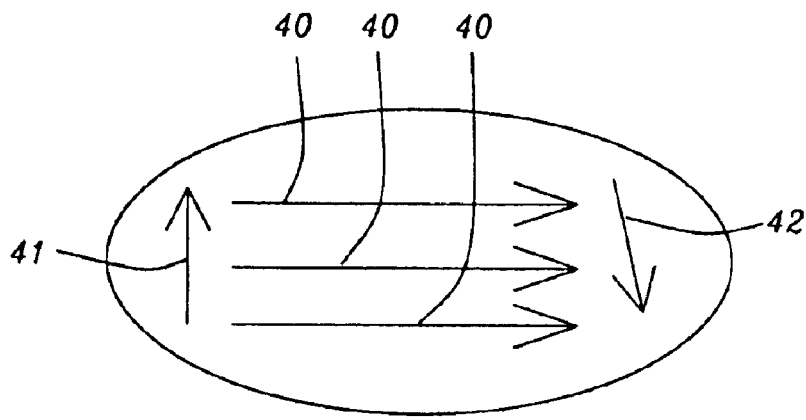
Figure 2B:
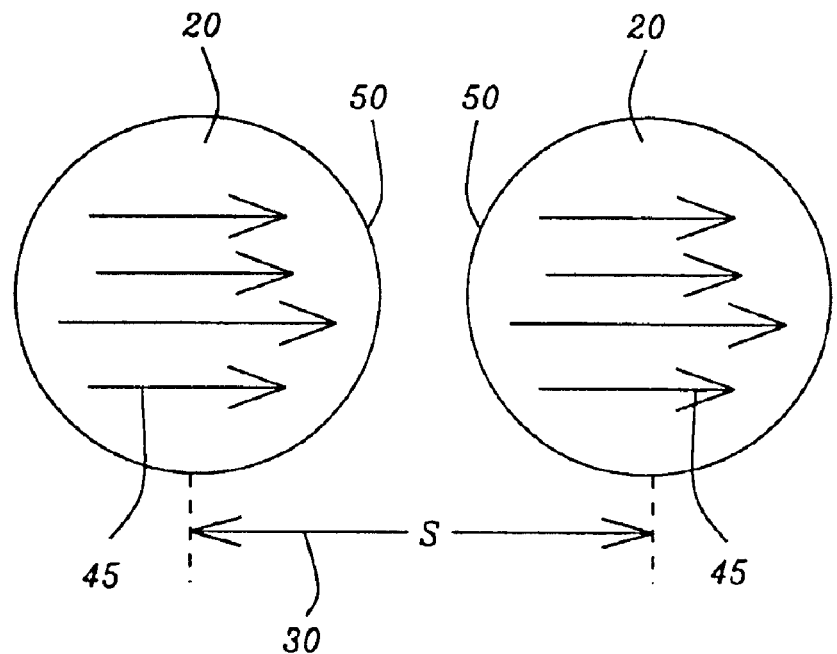

It is easiest to explain the method of the present invention by considering an elliptical element of the prior art broken up into a chain of circles. This is actually not an unreasonable model, since even lozenge shaped cells often have an elliptical appearance after they are formed by photolithographic processes. In what follows, referring to FIG. 2a, we will consider a prior art ellipse (10) of aspect ratio, c/a=2, (ratio of semi-major axis, c, to semi-minor axis, a), which can be replaced in the present invention by two circles of identical radius, a, (20), as shown in FIG. 2b. The size of the radius will generally be between approximately 0.1 and 0.5 microns. The center-to-center distance between the circles (30) is denoted s. It is noted that the spacing between the circles, (s-2a), and, indeed, the spacing between individual elements in all configurations and shapes, is between approximately 0 (where the elements substantially are nearly in contact) and approximately the diameter of the element. Spacing that is substantially larger could disadvantageously affect the coupling between elements. The figure of the ellipse in FIG. 2a also shows magnetization vectors (40) of the ellipse aligned advantageously along the major axis and magnetization vectors (41) and (42) disadvantageously aligned along the direction of randomly formed edge domains (curling). The two circles in FIG. 2b have their magnetization vectors all preferentially aligned along an easy axis and held at the circle edges (50) in a fanning mode (head-to-tail alignment) by magnetostatic coupling. It is the edge region (50) that will serve as a nucleation site for low threshold magnetization switching. In existing prior art designs, such as the ellipse of FIG. 2a, even cell sizes smaller than a domain size will exhibit curling of the magnetization vectors at the cell edges when the cell is isolated. This curling is a result of the reduction of magnetostatic energy within the isolated cell. If the magnetization vectors did not curl, there would be uncompensated poles at the ends of the cell, which is a higher magnetic energy state. When the cell is broken up into circular elements as in FIG. 2b, the magnetostatic interaction between the elements maintains the magnetization vectors in the more energetically advantageous fanning mode, since there are no uncompensated poles at the edges (50).

The switching coercivity of a single elliptical cell, $H_c$, is given by:

$$H_c = 2K_c/M_s + (N_a - N_c)M_s.$$

In this expression $K_c$ is the crystalline anisotropy, which is determined by film composition and processing conditions (such as layer formation in an external magnetic field) and is independent of the cell geometry. $M_s$ is the saturation magnetization and the term $(N_a-N_c)M_s$ represents the shape anisotropy of the cell. For an aspect ratio c/a=2, $(N_a-N_c)=$ 4.6425t/a, where t is the film thickness. Thus the shape anisotropy is directly proportional to $M_s t$ and is inversely proportional to feature size (represented by a).

The super-paramagnetic limit requires that, to prevent thermal fluctuations, $M_s t > 50$ kT/($H_c$S), where k is Boltzmann's constant, T is the absolute temperature and S is the cell area (S=πac for an ellipse of aspect ratio c/a). Thus, when scaling down cell area for high density applications while simultaneously attempting to maintain thermal stability, the coercivity will have to increase as a function of $1/a^2$ for a constant aspect ratio.

Since the magnetic field produced by the current in the bit line is only proportional to 1/a, this means that much more current is required at reduced cell sizes to overcome the increasing coercivity. This is why the single elliptical cell requires increased write-current power consumption. However, for the design of the present invention, in which two circles replace the single ellipse, their coercivity is:

$$H_c = 2K_c/M_s + N_i M_s,$$

because the circular shape does not produce a shape anisotropy. Instead, there is now an interaction anisotropy term, $N_i M_s$, in which $N_i$ is given by:

$$N_i = (\pi/4)t(a^2/s^3) = 0.785 t(a^2/s^3),$$

where s is the center-to-center distance between the circles. This term is less than 17% of the shape anisotropy contribution, depending on the value of s. The chain of ellipses, seen in FIG. 1b, can reduce this value still further when the major elliptical axis is perpendicular to the line joining the centers. It is noted, therefore, that the coercivity of the two circles is dominated by the crystalline anisotropy term, $2K_c/M_s$, whereas the coercivity of the original ellipse was dominated by the shape anisotropy, $(N_a-N_c)M_s$. Thus, the method of the present invention reduces the write-current power consumption and allows scaling to smaller dimensions. It should be noted from the formulas presented above, that an optimal choice of center-to-center distance for fabrication purposes depends on other features of the circular segments, such as radius and thickness.

The greatest advantage of the present invention is the ability it provides to control the switching mode during magnetization reversals. In prior art designs, any imperfection of the edge or shape of the ellipse or lozenge cells, or any defects within the cell, will serve as a nucleation site for magnetization switching and significantly reduce the switching threshold. Since these defects are uncontrollable, the variations in switching threshold will be randomly distributed among the cells in the array. In the present invention, the edges at the inside regions of the segments forming the cell will serve as artificial nucleation sites for the magnetization switching. As long as the role of the artificial sites dominates that of defects, the switching threshold will be determined by the intentional design and not by the random distribution of defects.

Figure 3A:
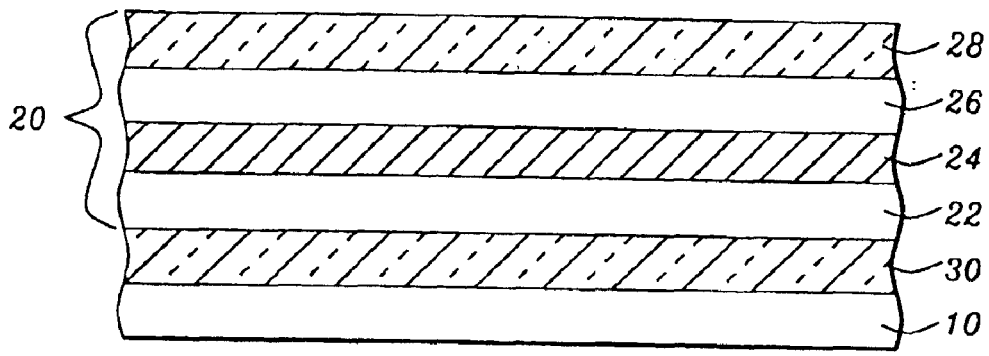
FIGS. 3a and 3b are schematic cross-sectional illustrations of two MTJ configurations suitable for use in a discrete cell element of the present invention. The MTJ configuration has an antiferromagnetically coupled fixed layer formed in accord with the method of this invention.

Referring to FIG. 3a, there is shown a cross-sectional view of an MTJ segment designed to efficiently achieve the objects of the present invention. It is understood that this segment is formed by ion-milling and photolithographic patterning of a larger sheet of MTJ layers as described below.

Referring to the figure, there is seen an MTJ segment formed by deposition methods such as ion-beam deposition or chemical vapor deposition comprising a ferromagnetic free layer (10) separated by an insulating tunneling layer (30) from a magnetically pinned layer (20). The pinned layer is itself a multilayer, comprising a first ferromagnetic layer (22) and a second ferromagnetic layer (26) separated by a coupling layer (24) formed of non-magnetic coupling materials such as Rh, Ru, Cr or Cu and formed to a thickness between approximately 5 and 50 angstroms. Ferromagnetic layers are preferably formed of materials such as CoFe, NiFe, CoNiFe, CoZrTa, CoFeB or CoHfTa. The insulating tunneling layer is preferably formed of oxides such as $Al_2O_3$, $ZrO_2$ or $HfO_2$ (or combinations thereof) to a thickness between approximately 5 and 50 angstroms. The magnetizations of the first and second ferromagnetic layers are strongly coupled in antiparallel directions and pinned by an antiferromagnetic layer (28) such as a layer of PtMn, NiMn, OsMn, IrMn, NiO or CoNiO, positioned adjacent to the second ferromagnetic layer and formed to a thickness between approximately 30 and 300 angstroms. The material composition and thicknesses of the first and second ferromagnetic layers are chosen so that their magnetizations are essentially equal in magnitude. Thus, when the magnetizations are fixed in opposite directions, the net magnetic moment of the pinned layer is substantially zero. Appropriate materials are the ferromagnetic materials such as CoFe, NiFe, CoNiFe, CoZrTa, CoFeB, CoZrTa, CoNbTa and CoHfTa. Appropriate thicknesses are between approximately 20 and 200 angstroms.

Figure 3B:
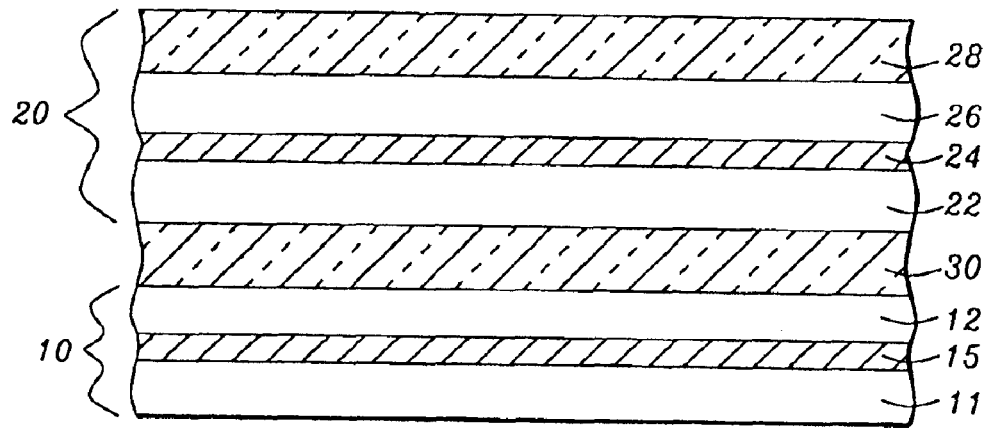

Also within the capabilities of the present preferred embodiment and as shown in FIG. 3b, is the formation of the ferromagnetic free layer (10) as a multilayer comprising two ferromagnetic layers ((11) and (12)) of opposite magnetizations separated by a non-magnetic spacer layer (15). By choosing the thickness of the spacer layer, the free layer ferromagnetic layers can be coupled either weakly (magnetostatically coupled) or strongly (exchange coupled).

It is understood that an MTJ of the type described above can be formed into segments and multi-segmented sections in accord with the objects of the present invention using photolithographic and ion-milling methods well know to those skilled in the art. In particular, an MTJ stack is first formed as a sheet of the MTJ layers described above and then, using photolithographic and ion-milling processes, the sheet is patterned into appropriate multi-segment cells of desired shape wherein individual segments can have diameters within an approximate range between 0.05 and 1.5 microns and with a comparably chosen separation between said segments sufficient to allow the desired magnetostatic coupling between said segments. Also, as is known by practitioners of the art, the magnetic layers of the MTJ stack can be formed with an arbitrarily chosen direction of crystalline anisotropy, so that the segments can be aligned with the line joining their centers having a desired angle with the direction of crystalline anisotropy.

Figure 4:
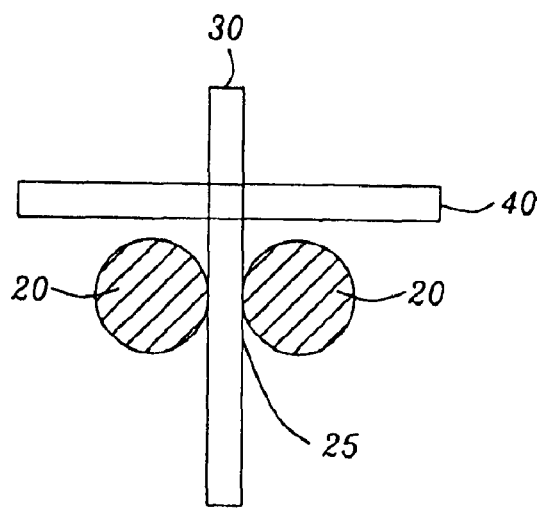
FIG. 4 is a schematic illustration of a two-segment multi-segmented cell at the intersection of two conductive lines.

Referring finally to FIG. 4, there is shown a schematic diagram of a multi-segmented (only two elements shown for simplicity) MTJ cell element (20) located at the intersection of two conducting lines (30) and (40) with the intersection appropriately placed adjacent to the nucleation site of said cell (25). It is understood that these two lines may be in different vertical planes, so that one line may be above the cell and the other below the cell. It is understood that an array of such cells can be constructed wherein each member of the array is situated (in a manner not described herein) relative to intersecting conductive lines so that the array forms an MRAM memory array. It is further understood from the objects of the invention that such an MRAM array would have a uniform coercivity and not be subject to variations in switching fields required to change magnetization directions and store data.

As is understood by a person skilled in the art, the preferred embodiment of the present invention is illustrative of the present invention rather than being limiting of the present invention. Revisions and modifications may be made to methods, processes, materials, structures, and dimensions through which is formed a magnetostatically coupled, multi segmented MTJ element for an MRAM array providing a lowered threshold for state switching and a uniformity of coercivity across the array, while still providing a magnetostatically coupled, multi segmented MTJ element for an MRAM array providing a lowered threshold for state switching and a uniformity of coercivity across the array, formed in accord with the present invention as defined by the appended claims.

What is claimed is:

1. A method for fabricating a magnetostatically coupled multi-segmented magnetic tunnel junction (MTJ) cell, said cell having artificial nucleation sites for magnetization switching and a reduced sensitivity to defects and shape irregularities comprising:

forming an MTJ layered stack, the magnetic layers of said stack having a common crystalline anisotropy;

patterning within said stack, by photolithograpy and ion-milling methods, at least two discrete, separated MTJ cell segments of certain geometrical shape, the centers of said segments being distributed along a common line and forming, thereby, a linear chain of cell segments; and magnetizing said segments along the direction of said common line, whereby the magnetization of said segments is maintained by magnetostatic coupling between said segments.

2. The method of claim 1 wherein the method of forming the MTJ stack further comprises:

forming a ferromagnetic free layer;

forming an insulating tunneling layer on said free layer;

forming a multi-layered magnetically pinned layer on said tunneling layer, said pinned layer formation further comprising:

forming a first ferromagnetic layer adjacent to said tunneling layer;

forming a non-magnetic coupling layer on said first ferromagnetic layer;

forming a second ferromagnetic layer on said coupling layer;

forming an antiferromagnetic pinning layer on said second ferromagnetic layer, wherein said multi-layered magnetically pinned layer has a net magnetic moment which is substantially zero as a result of the magnetic moments of said first and second ferromagnetic layers being substantially equal and strongly magnetically coupled in an anti-parallel configuration.

3. The method of claim 2 wherein said free magnetic layer is formed as a multilayer comprising a third and fourth ferromagnetic layer separated by a non magnetic spacer layer and wherein the magnetizations of said ferromagnetic layers are substantially equal and may be weakly or strongly coupled in antiparallel directions.

* * * * *

UNITED STATES PATENT AND TRADEMARK OFFICE
CERTIFICATE OF CORRECTION

PATENT NO. : 6,943,040 B2
DATED : September 13, 2005
INVENTOR(S) : Tai Min and Po Kang Wang It is certified that error appears in the above-identified patent and that said Letters Patent is hereby corrected as shown below:

Title page,
Item [75], Inventors, delete "Po Kang Wang, Milpitas, CA (US)" and replace with -- Po Kang Wang, San Jose, CA (US) --.

Signed and Sealed this

Sixth Day of December, 2005

JON W. DUDAS
*Director of the United States Patent and Trademark Office*